United States Patent [19]

Figh

[11] Patent Number: 4,827,220

[45] Date of Patent: May 2, 1989

[54] METHOD AND APPARATUS FOR TESTING BATTERIES

[75] Inventor: Jack N. Figh, Montgomery, Ala.

[73] Assignee: Intermark Corp., New York, N.Y.

[21] Appl. No.: 113,632

[22] Filed: Oct. 26, 1987

[51] Int. Cl.⁴ ............................................. G01N 27/46
[52] U.S. Cl. ..................................... 324/426; 340/636
[58] Field of Search ............... 324/426, 428, 429, 430, 324/433; 320/48; 340/636

[56] References Cited

U.S. PATENT DOCUMENTS

| | | | |
|---|---|---|---|
| 4,193,026 | 3/1980 | Finger et al. | 324/428 |
| 4,520,353 | 3/1985 | McAuliffe | 324/429 |
| 4,670,703 | 6/1987 | Williams | 320/48 |

FOREIGN PATENT DOCUMENTS 114969  9/1980  Japan ................................... 324/426

Primary Examiner—Reinhard J. Eisenzopf
Assistant Examiner—Anthony L. Miele
Attorney, Agent, or Firm—Bert J. Lewen; Henry Sternberg

[57] ABSTRACT

A circuit for testing a computer battery without removing it from the computer includes a plurality of serially connected resistors, and a transistor connected to saturate. The voltages at the junctions of the transistors is sensed by a logic device such as a buffer, for application to the data bus of the computer. The transistor may be controlled from the computer via a latch. The resistors have values to produce voltages at two sensed resistor junctions such that the corresponding logic levels applied to the computer are the same, at a first level, when the battery voltage is acceptable, are the same at another logic level when the battery voltage is unacceptable, and are different when the battery voltage is between acceptable and unacceptable voltage values.

16 Claims, 1 Drawing Sheet

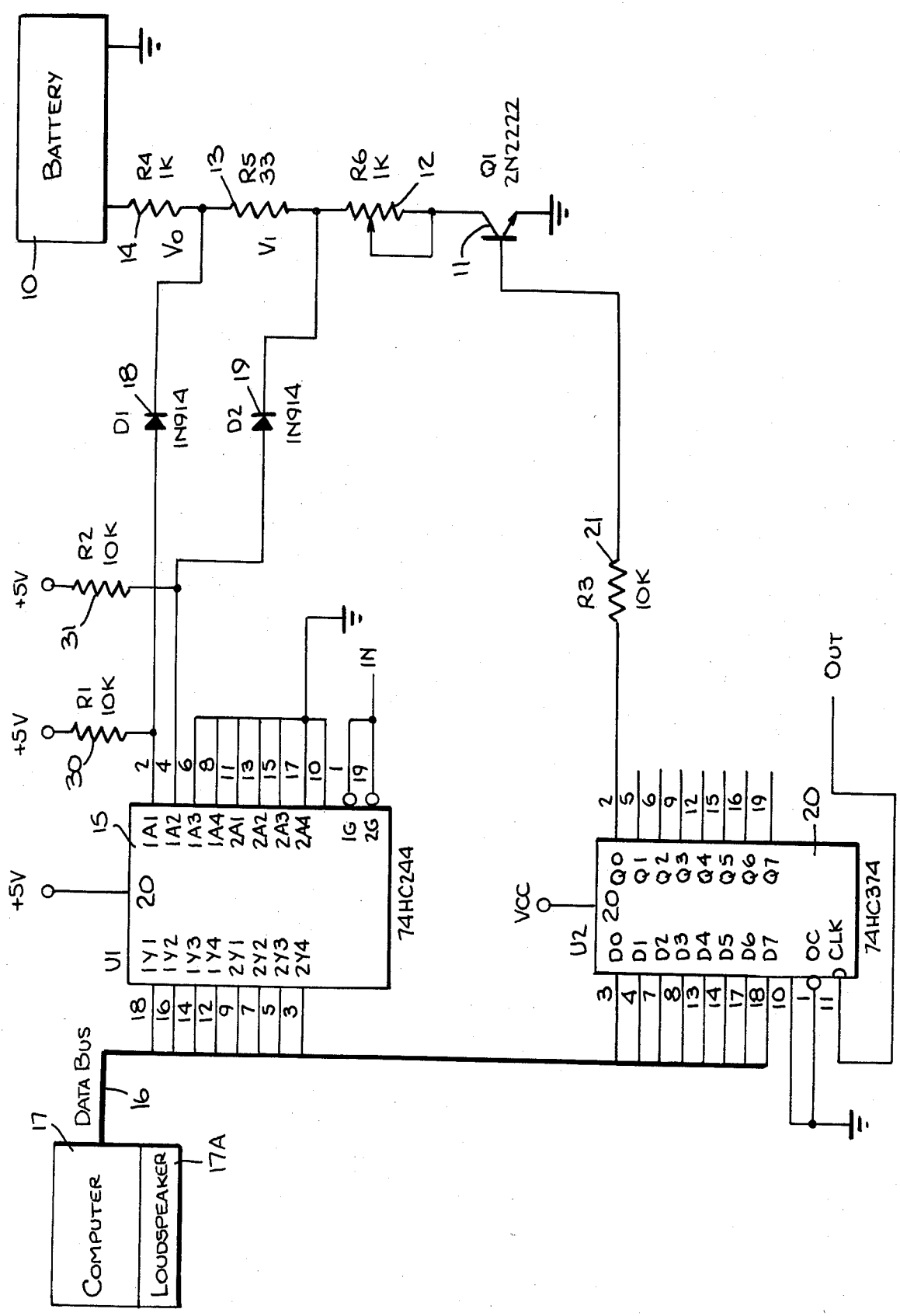

METHOD AND APPARATUS FOR TESTING BATTERIES

BACKGROUND OF THE INVENTION

This invention relates to a method and apparatus for testing batteries, and is more in particular directed to a method and apparatus enabling the testing by a computer, e.g. a microcomputer, of a battery supply for the computer.

Batteries, such as battery packs, are frequently employed to power computers, especially portable computers. While the batteries may have sufficient energy to guarantee a determined service life of, for example, six months, experience has shown that the batteries can, in fact, last much longer in some computers, where the use of the computer is low, than in other computers having normal usage.

It is therefore desirable to be able to determine the condition of a battery for a computer readily and accurately, without removing the battery from the computer, in order to insure that the battery is not replaced prematurely.

SUMMARY OF THE INVENTION

In order to enable testing by a computer of its batteries without removal, in accordance with the invention a test circuit and method are provided for determining the condition of the battery.

Briefly stated, in accordance with one embodiment of the invention, the circuit includes a transistor having its emitter-collector circuit connected to the battery via a plurality of resistors. The computer is connected to saturate the transistor, and the voltages across the resistors are sensed to determine if they fall within given voltage ranges indicative of the condition of the battery.

The voltage level ranges to be tested are advantageously set to be in accordance with the threshold input levels of an integrated circuit. A TTL device may be responsive, for example, to a minimum high input voltage of 2 volts and a maximum low input voltage of 0.8 volts to cause a change in its output state. The resistors of the testing circuit are selected such that voltages at their junctions, which are indicative of battery condition, are either 2 volts or 0.8 volts at determined arbitrarily defined discharge conditions of the battery. By applying the voltages at the different resistor terminals to the inputs of a TTL device, then the outputs of the TTL device have HIGH or LOW levels selectively responsive to the battery condition, and these levels may be readily interpreted by the computer to provide an indication of the condition of its batteries.

It is of course apparent that the invention is not limited to the use of TTL devices and transistors, as in the above discussed example, and that elements of other conventional device families may be alternatively employed in accordance with the invention.

Computers, such as microcomputers and the like, frequently have a few input and output port bits that are unused, and in an especially advantageous arrangement in accordance with the invention, such unused bits may be employed as an interface for the testing circuit.

The computer may thus have a program which enables the battery test circuit, senses the voltages across the resistors, and hence determines the condition of the battery connected thereto.

BRIEF DESCRIPTION OF THE DRAWING

In order that the invention may be more clearly understood, it will now be explained in greater detail with reference to the accompanying drawing, wherein the single FIGURE of the drawing illustrates a preferred schematic diagram of a circuit in accordance with the invention.

DETAILED DISCLOSURE OF THE INVENTION

Referring now to the drawing, in accordance with a preferred embodiment of the invention, for testing the condition of a battery 10, the collector of a transistor 11 is connected to the positive terminal of the battery by way of resistors 12, 13 and 14, in that order, and the emitter of the transistor and the negative terminal of the battery are grounded. The resistor 12 is variable to permit calibration of the circuit.

Outputs D0–D1 of a buffer 15, such as an octal Tri-State buffer type 74HC244, are connected to the data bus 16 of a microcomputer 17, which may be of conventional construction, and the corresponding inputs I0–I1 are connected, via diodes 18,19, to the junction of resistors 13 and 14, and 12 and 13, respectively. These two inputs are also connected to the 5 volt supply via resistors 30,31 respectively.

The buffer inputs are thus held HIGH by the resistors 30,31 and are influenced by the voltages at the resistor junctions only when these voltage drop below about 4.4 volts (5 volts minus the drop across the diode). When the voltage at a resistor junction is above about 2 volts, the corresponding buffer output has one logic level, and when it is below about 0.8 volts the output has its other logic level. The output level, which is applied to the computer via the data bus, thus enables the computer to sense determined ranges of the voltages at the resistor junctions, based upon the threshold voltages of the buffer. In accordance with the invention, the resistors 12–15 are relatively proportioned such that the sensed ranges are representative of the conditions of the battery.

The base of the transistor 11 is connected to the output of a latch 20, which may be a type 74HC374 octal D-type transparent latch, via a resistor 21. The input of the latch is connected to the D0 line of the data bus.

The clock of the latch, indicated as negated OUT, and the enable input of the buffer 15, indicated as negated IN, are generated in the computer by conventional address decoding techniques, to clock the latch and enable the buffer, respectively.

The latch 20 serves the function of holding the bias of the transistor, during the sensing of the voltages of the resistor junctions, at a level at which the transistor is saturated, so that substantially the full voltage of the battery appears across the series resistors.

The connections of the other inputs and outputs of the buffer 15 and latch 20 are immaterial insofar as the invention is concerned. The computer preferably has a loudspeaker 17A that can be conventionally internally programmed to emit audio tones of controllable frequency.

Typical values for the components are shown on the drawing, and will not be discussed further, except to state that the resistance of resistor 13 is preferably much smaller than the sum of the resistances of resistors 12 and 14. The 5 volt supply may be derived from the battery 10, via a regulator, so that the supply for the components of the circuit will be substantially constant even though the voltage of the battery 10 varies. In the illustrated example, $V_{BATTERY}$ is the voltage of the battery 10, and may be up to 10 volts.

In the following analysis, $V_0$ is the voltage at the junction of resistors 13 and 14, and $V_1$ is the voltage at the junction of resistors 12 and 13. $V_{GOOD}$ is the voltage of the battery when replacement need not be considered, $V_{REPLACE}$ is the voltage of the battery when it should be replaced, and $V_{MARGINAL}$ is the voltage of the battery intermediate the GOOD and REPLACE values. These values may be assigned on the basis of experience.

In the calibration of the illustrated circuit, with a voltage applied to the battery terminal between $V_{REPLACE}$ and $V_{GOOD}$, and the transistor saturated, the resistor 12 is adjusted such that the computer senses the level of $V_0$ as being at logic HIGH level and senses the level of $V_1$ as being at logic L0 level. If the voltage applied to the battery terminals is now set to $V_{GOOD}$, the computer will sense HIGH levels at both $V_0$ and $V_1$. If the voltage applied to the battery terminals is less than $V_{REPLACE}$, the computer will sense logic LOW levels at both $V_0$ and $V_1$, indicating a weak battery.

As above discussed, the negated IN and OUT signals for control of the buffer and latch may be generated by conventional addressing arrangements. For example, conventional decoders may be provided in the computer, for selecting addresses assigned to these functions, whereby addressing of the respective selected address in the program of the computer effects the generation of the negated IN and OUT signals.

Routines that may be employed in the computer 17 for controlling the circuit of the drawing are as follows:

|  | Source File | Equates.S |  |
|---|---|---|---|
| OUTPUT | EQU | 0FFF4H |  |
| INPUT | EQU | 0FFF0H |  |
| RAMSTART | EQU | 4000H |  |
| RAMSIZE | EQU | 800H |  |
| STACKTOP | EQU | RAMSTART+RAMSIZE |  |
| BGOOD | EQU | 03H | ;BATTERY GOOD |
| BMARG | EQU | 01H | ;BATTERY MARGINAL |
| BREPL | EQU | 00H | ;BATTERY REPLACE |
| BTESTEN | EQU | 01H | ;BATTERY TEST ENABLE |
| BTESTOFF | EQU | 00H | ;BATTERY TEST OFF |

|  |  | Source File | Diagnose.S |
|---|---|---|---|
|  | EXTRN | TONELOW,TONEMED,TONEHIGH |  |
|  | PUBLIC | BATTADJ |  |
|  | NAME | RDIAGNOS |  |
| PROGRAM | CSECT |  |  |
|  | INSERT | B:EQUATES.S |  |
|  | LD | SP,STACKTOP |  |
| BATTADJ | CALL | BATTEST | ;CHECK BATTERY LEVEL |
|  | CP | BGOOD | ;IS IT 'GOOD'? |
|  | JR | NZ,ADJNGOOD | ;IF NOT, JUMP |
|  | CALL | TONEHIGH | ;IF SO, TONE HIGH |
|  | JR | BATTADJ |  |
| ADJNGOOD | BMARG | ;IS IT MARGINAL? |  |
| CP |  |  |  |
|  | JR | NZ.ADJMARG | ;IF NOT, JUMP |
|  | CALL | TONEMED | ;IF SO, MEDIUM TONE |
|  | JR | BATTADJ |  |
| ADJMARG | CALL | TONELOW | ;MUST BE 'REPLACE' |
|  | JR | BATTADJ |  |
| ; |  | BATTEST | BATTERY LEVEL CHECK ROUTINE |
| ; |  |  | RESULT RETURNED AS (A) |
| BATTEST | LD | A,BTESTEN | ;ENABLE BATTERY TEST |
|  | LD | (OUTPUT),A |  |
|  | LD | A,(INPUT) | ;CHECK BATTERY LEVELS |
|  | AND | 03H | ;ISOLATE b1-b0 |
|  | PUSH | AF | ;SAVE DATA |
|  | LD | A,BTESTOFF | ;DISABLE BATTERY TEST |
|  | LD | (OUTPUT),A |  |
|  | POP | AF | ;RETRIEVE DATA |
|  | RET |  |  |
|  | END |  |  |

In these programs, the TONE commands are directed to conventional routines for controlling the computer to emit low, medium and high pitched tones. The calibration routine employs these three tones to indicate GOOD. MARGINAL and REPLACE conditions of the battery.

In the calibration procedure, it is apparent that the tone emitted by the computer may be employed as an indicator in the setting of the resistor 12, i.e. the resistor 12 is adjusted when in the battery check routine, until the medium pitch tone is emitted, when the battery voltage is in the MARGINAL range.

The program as above discussed in written in assembly code for a Z-80 microprocessor.

While the invention has been disclosed with reference to a single example, it is apparent that many variations and modifications may be made therein, and it is therefore intended in the following claims to cover each such variation and modification as falls within the true spirit and scope of the invention.

What is claimed is:

1. A circuit for testing the condition of a battery and having a pair of terminals to which a battery is adapted to be connected, said circuit comprising a series circuit of a plurality of resistors and a switching means, said resistors defining first and second junctions, control means for controlling said switching means to connect said resistors between said terminals, and sensing means for sensing the voltage levels at said first and second junctions of said resistors, said sensing means comprising threshold sensing means for producing first and second logic level outputs in response to determined voltages at said first and second junctions, and means for enabling said sensing means to sense the voltages at said first and second junctions, whereby the condition of a battery connected to said terminals is indicated by the voltages sensed at both said first and second junctions at any given time.

2. The circuit of claim 1 wherein said switching means comprises a transistor and said control means for said switching means comprises a latching circuit, and means for controlling said latching circuit to apply a saturation bias to said transistor.

3. The circuit of claim 1 wherein said sensing means comprises a logic element having first and second inputs and first and second outputs, the voltage at said outputs being of either a logic HIGH level or a logic LOW level, said logic element being selectively responsive to voltages above a minimum first voltage and below a maximum second voltage, for establishing the output level thereof, said second voltage being less than said first voltage.

4. The circuit of claim 3 wherein said plurality of resistors comprises first, second and third resistors, said resistors having values to set both of the logic element outputs to a first level when the battery has an acceptable voltage, to set both of the logic element outputs to a second level when the battery has an unacceptable voltage, and to set the logic element outputs to different levels when the voltage of said battery is between said first and second voltages.

5. The circuit of claim 4 wherein said logic element comprises a buffer, and said means enabling said sensing means comprises means for enabling said buffer.

6. The circuit of claim 5 wherein said buffer is a TTL buffer.

7. The circuit of claim 5 wherein said switching means comprises a transistor and said control means for said switching means comprises a latching circuit, and means for controlling said latching circuit to apply a saturation bias to said transistor.

8. The circuit of claim 7 wherein said means controlling said latching circuit comprises a computer having an addressable output connected to said latching circuit as a clock signal, said computer being connected to receive the output of said buffer.

9. The circuit of claim 8 wherein said computer comprises loudspeaker means, and means responsive to the outputs of said buffer for controlling the tone of audio signals emitted by said loudspeaker means.

10. The method of determining the condition of a battery comprising controlling a transistor to pass saturation current from the battery through first, second and third serially connected resistors, sensing the voltage at a first junction between said first and second resistors with a first threshold device to establish the output level of the first threshold device at a first level when the voltage at said first junction is above a first voltage, and simultaneously sensing the voltage at a second junction between said second and third resistor with a second threshold device to establish the output level of the second threshold device at a second level when the voltage at said second junction is below a second voltage, said second voltage being less than said first voltage.

11. The method of claim 10 comprising adjusting the relative values of said resistors to produce the same first level outputs of said threshold devices when the battery voltage is acceptable, to produce the same second level outputs of said threshold devices when the battery voltage is unacceptable, and to produce different level outputs when the voltage of said battery is between acceptable and unacceptable voltages.

12. The circuit of claim 1 further comprising operating supply terminal means independent of said pair of terminals adapted to be connected to a source of operating voltage, wherein said sensing means comprises a buffer having first and second inputs, each of said inputs being connected to a separate one of said junctions by way of a second diode, each of said inputs being connected to said supply terminal by way of a separate resistor.

13. The circuit of claim 12 wherein said buffer has first and second outputs and said enabling means comprises an enable terminal on said buffer for enabling the application of determined logic level voltages at said first and second outputs in response to the application of determined logic level voltages at said first and second inputs, respectively.

14. The circuit of claim 1 wherein said first junction is at a higher voltage position of said series resistors than said second junction, and further comprising means responsive to the output voltages of said sensing means when the voltages at said first and second junctions are above a first level for indicating that a battery connected to said terminals is good, means responsive to the output voltages of said sensing means when the voltage at said first junction is above said first level and the voltage at said second junction below a second level for indicating that the battery is marginal, and means responsive to the output voltages of said sensing means when the voltage at said first and second junctions is below said second level for indicating that said battery should be replaced.

15. The circuit of claim 14 wherein said sensing means comprises a buffer, and first and second comparing means connecting said buffer to said first and second junctions, respectively.

16. The circuit of claim 15 wherein said comparing means comprises diodes connecting said buffer to said junctions, a terminal adapted to be connected to a source of a reference potential, and resistors connecting said buffer to said terminal.

* * * * *